(12) United States Patent
Bulatowicz

(10) Patent No.: US 10,451,694 B2
(45) Date of Patent: Oct. 22, 2019

(54) PROBE BEAM FREQUENCY STABILIZATION IN AN ATOMIC SENSOR SYSTEM

(71) Applicant: Michael D. Bulatowicz, Canoga Park, CA (US)

(72) Inventor: Michael D. Bulatowicz, Canoga Park, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 1628 days.

(21) Appl. No.: 14/188,436

(22) Filed: Feb. 24, 2014

(65) Prior Publication Data

US 2019/0293736 A1    Sep. 26, 2019

(51) Int. Cl.
*G01R 33/44* (2006.01)
*G01C 19/62* (2006.01)
(Continued)

(52) U.S. Cl.
CPC .............. *G01R 33/44* (2013.01); *G01C 19/62* (2013.01); *G01R 33/032* (2013.01); *G01C 19/60* (2013.01)

(58) Field of Classification Search
CPC ...... G01C 19/62; G01C 19/60; G01R 33/032; G01R 33/44
See application file for complete search history.

(56) References Cited

U.S. PATENT DOCUMENTS 4,157,495 A    6/1979    Grover et al.
7,202,751 B2   4/2007    Zhu et al.
(Continued)

FOREIGN PATENT DOCUMENTS

EP    2835661 A1    2/2015
JP    2003273566 A  9/2003
(Continued)

OTHER PUBLICATIONS

Marchant, Anna L., et al. "Off-resonance laser frequency stabilization using the Faraday effect." Optics letters 36.1 (2011): 64-66 (Year: 2011).*
European Search Report for corresponding EP2910964 A1 dated Jun. 17, 2015; Completed by Examiner of Munich.
Marchant, et al., "Off-Resonance Laser Frequency Stabilization Using the Faraday Effect", *Optics Letters, Optical Society of America*, U.S., vol. 36, No. 1, Jan. 1, 2011 (Jan. 1, 2011), pp. 64-66, X001559809, ISSN: 0146-9592, DOI: 10.1364/OL.36.000064 *Whole Document*.

(Continued)

*Primary Examiner* — Wyatt A Stoffa
(74) *Attorney, Agent, or Firm* — Tarolli, Sundheim, Covell & Tummino LLP

(57) ABSTRACT

One example embodiment includes an atomic sensor system. The system includes a vapor cell comprising an alkali metal vapor that precesses in response to a magnetic field. The system also includes a probe laser that generates an optical probe beam that is modulated about a center frequency and which is provided through the vapor cell. A photodetector assembly generates an intensity signal corresponding to a Faraday rotation associated with a detection beam that is associated with the optical probe beam exiting the vapor cell. The system further includes a detection system configured to demodulate the intensity signal at a frequency corresponding to a modulation frequency of the optical probe beam and to generate a feedback signal based on the demodulated intensity signal. The feedback signal is provided to the probe laser to substantially stabilize the center frequency of the optical probe beam based on the feedback signal.

18 Claims, 4 Drawing Sheets

(51) Int. Cl.
    *G01R 33/032*     (2006.01)
    *G01C 19/60*     (2006.01)

(56) References Cited

U.S. PATENT DOCUMENTS

| | | | |
|---|---|---|---|
| 7,439,814 B2 * | 10/2008 | Happer | G04F 5/145 |
| | | | 324/302 |
| 7,573,264 B2 * | 8/2009 | Xu | G01R 33/26 |
| | | | 324/301 |
| 9,500,725 B2 * | 11/2016 | Bulatowicz | G01R 33/26 |
| 2005/0169590 A1 | 8/2005 | Alkeskjold | |
| 2007/0205767 A1 * | 9/2007 | Xu | G01R 33/26 |
| | | | 324/304 |
| 2011/0031969 A1 * | 2/2011 | Kitching | G01R 33/0286 |
| | | | 324/304 |
| 2014/0184216 A1 * | 7/2014 | Walker | G01C 19/62 |
| | | | 324/305 |

FOREIGN PATENT DOCUMENTS

| | | |
|---|---|---|
| WO | WO 2006/071891 A2 | 7/2006 |
| WO | WO 2012/106094 A1 | 8/2012 |

OTHER PUBLICATIONS

Qin Jie, et al., "Light Intensity Fluctuation Insensitive Faraday Polarimeter for Atomic Magnetometer", *Electronic Measurement & Instruments* (ICEMI), 2011 10$^{th}$ International Conference on, IEEE, Aug. 16, 2011 (Aug. 16, 2011), pp. 215-219, XP032057697, DOI: 10.1109/ICEMI.2011.6037800, ISBN: 978-1-4244-8158-3 *p. 216—right hand column*.

Bulatowicz, et al., "Compact Atomic Magnetometer for Global Navigation (NAV-CAM)", Plans 2012—Proceedings of IEEE/ION Plans 2012, *The Institute of Navigation*, 8551 Rixlew Lane Suite 360 Manassas, VA 20109, USA, Apr. 26, 2012 (Apr. 26, 2012), pp. 1088-1093, XP056001132 *Figure 3*.

Kerckhoff, et al., "A Frequency Stabilization Method for Diode Lasers Utilizing Low-Field Faraday Polarimetry", *Review of Scientific Instruments*, AIP, Melville, NY, US, vol. 76, No. 9, Sep. 7, 2005 (Sep. 7, 2005), pp. 093108-1 through 093108-6, XP012079692, ISSN: 0034-6748, DOI: 10.1063/1.2038305 *Section IV*.

European Office Action for Application No. 16 150 518.5 dated Jun. 19, 2019.

\* cited by examiner

PROBE BEAM FREQUENCY STABILIZATION IN AN ATOMIC SENSOR SYSTEM

TECHNICAL FIELD

The present invention relates generally to sensor systems, and specifically to probe beam frequency stabilization in an atomic sensor system.

BACKGROUND

Atomic sensors, such as nuclear magnetic resonance (NMR) gyroscopes and atomic magnetometers, employ optical beams to operate, such as to detect rotation about a sensitive axis or to detect the presence and magnitude of an external magnetic field. As an example, an NMR sensor system can employ a first optical beam as a pump beam. For example, the pump beam can be a circularly-polarized optical beam that is configured to spin-polarize an alkali metal vapor, such as cesium (Cs) or rubidium (Rb), within a sealed cell of the sensor. The NMR sensor system can also employ a second optical beam as a probe beam. For example, the probe beam can be a linearly-polarized optical beam that is configured to indirectly detect precession of noble gas isotopes, such as xenon (Xe), based on the directly measured precession of the alkali metal, such as for detecting rotation of the detection system about the sensitive axis or detecting the magnitudes of the external magnetic field.

SUMMARY

One example embodiment includes an atomic sensor system. The system includes a vapor cell comprising an alkali metal vapor that precesses in response to a magnetic field. The system also includes a probe laser that generates an optical probe beam that is modulated about a center frequency and which is provided through the vapor cell. A photodetector assembly generates an intensity signal corresponding to a Faraday rotation associated with a detection beam that is associated with the optical probe beam exiting the vapor cell. The system further includes a detection system configured to demodulate the intensity signal at a frequency corresponding to a modulation frequency of the optical probe beam and to generate a feedback signal based on the demodulated intensity signal. The feedback signal is provided to the probe laser to substantially stabilize the center frequency of the optical probe beam based on the feedback signal.

Another embodiment includes a method for stabilizing a frequency of an optical probe beam in an atomic sensor system. The method includes providing the optical probe beam through a vapor cell of the atomic sensor system comprising a precessing alkali metal vapor. The method also includes beam-splitting the optical probe beam exiting the vapor cell into orthogonal polarization components and measuring an intensity of each of the orthogonal polarization components to generate a first intensity signal and a second intensity signal. The method also includes adding the first and second intensity signals to generate a summation signal and generating a feedback signal associated with a magnitude of the summation signal. The method further includes stabilizing the frequency of the optical probe beam based on the feedback signal.

Another embodiment includes an atomic sensor system. The system includes a vapor cell comprising an alkali metal vapor that precesses in response to a magnetic field. The system also includes a probe laser configured to generate an optical probe beam that is modulated about a center frequency via a square-wave modulation signal and which is provided through the vapor cell. The system also includes a photodetector assembly configured to generate a first intensity signal and a second intensity signal that correspond, respectively, to orthogonal polarizations of a detection beam corresponding to the optical probe beam exiting the vapor cell. The system further includes a detection system configured to add the first and second intensity signals to generate a summation signal and to demodulate the summation signal at a frequency of the square-wave modulation signal to generate a feedback signal that is provided to the probe laser to substantially stabilize the center frequency of the optical probe beam.

DETAILED DESCRIPTION

The present invention relates generally to sensor systems, and specifically to probe beam frequency stabilization in an atomic sensor system. The NMR sensor system can be implemented, for example, as an NMR gyroscope or an atomic magnetometer. The NMR probe system includes a pump laser configured to generate an optical pump beam and a probe laser configured to generate an optical probe beam. The optical pump beam can be provided through the vapor cell, such as via beam optics, to stimulate the alkali metal vapor therein. The optical probe beam can be provided through the vapor cell orthogonally relative to the optical pump beam to measure a characteristic of the optical probe beam in response to polarization of the alkali metal vapor, which can be modulated in response to precession of noble gas isotopes based on the interaction of the alkali metal vapor with the noble gas isotopes. Thus, the optical probe beam can be implemented to measure rotation about a sensitive axis, in the example of the NMR gyroscope, or to measure a magnitude of an external magnetic field, in the example of the atomic magnetometer.

As an example, the optical probe beam can be modulated with a modulation signal, such as a square-wave modulation signal, about a center frequency. The optical probe beam can be provided to a pair of photodetectors arranged orthogonally with respect to a polarizing beamsplitter as it exits the vapor cell. Thus, the optical probe beam can be split into a first intensity signal and a second intensity signal that correspond respectively to orthogonal polarizations of the optical probe beam. The first and second intensity signals can be added to generate a summation signal that can be demodulated at a frequency that is approximately equal to a frequency of the square-wave signal. Thus, the optical probe beam can be stabilized based on the amplitude of the demodulated summation signal. As an example, the center frequency can correspond to a frequency of maximum absorption of the optical probe beam by the alkali metal vapor, such that the system can maintain the demodulated summation signal at a substantially constant amplitude corresponding to approximately equal and opposite Faraday rotation about center frequency at each of the positive and negative amplitudes about the center frequency in steady state conditions. For example, each of the positive and negative amplitude of the modulation signal can correspond to maximum Faraday rotation in approximately equal and opposite directions in steady state conditions, such that demodulation of a difference signal corresponding to a difference of the first and second intensity signals can be determinative of a Faraday rotation resulting from an external magnetic field or rotation of the system about a sensitive axis.

Figure 1:
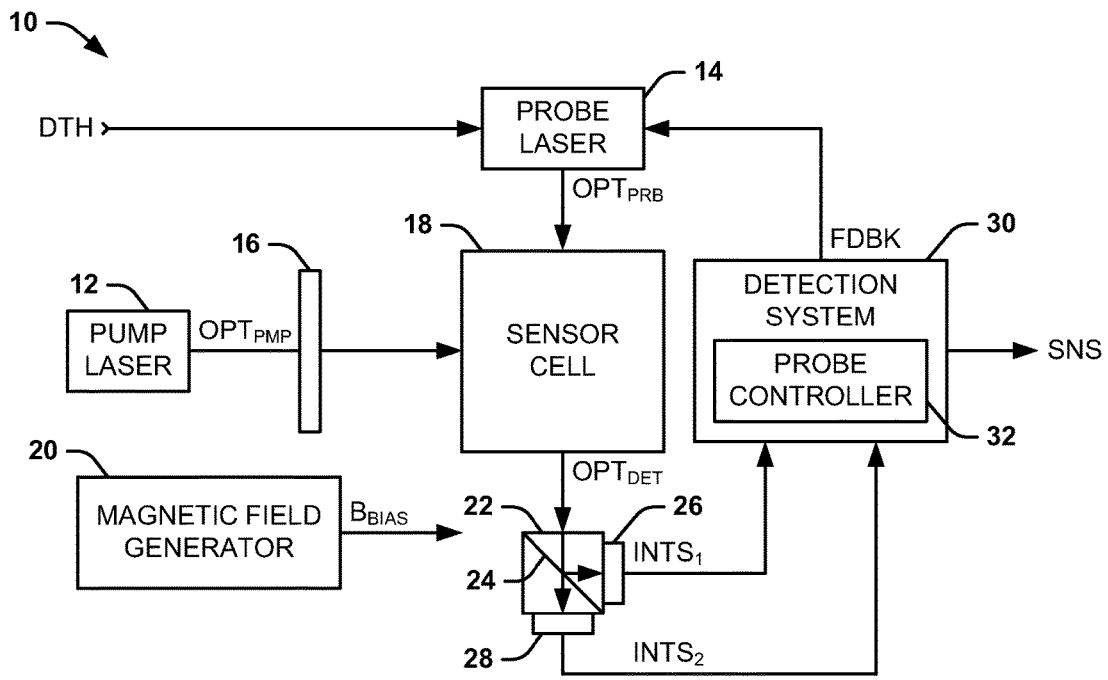
FIG. 1 illustrates an example of an atomic sensor system.

FIG. 1 illustrates an example of an atomic sensor system 10. The atomic sensor system 10 can correspond to any of a variety of NMR sensors, such as an NMR gyroscope that is configured to measure rotation about a sensitive axis or an atomic magnetometer that is configured to measure a magnitude of an externally provided magnetic field. The atomic sensor system 10 can thus be provided in any of a variety of applications, such as navigation and/or defense applications.

The atomic sensor system 10 includes a pump laser 12 configured to generate an optical pump beam $OPT_{PMP}$ and a probe laser 14 configured to generate an optical probe beam $OPT_{PRB}$. The optical pump beam $OPT_{PMP}$ is provided through a quarter-wave plate 16 that is configured to circularly polarize the optical pump beam $OPT_{PMP}$, such that the optical pump beam $OPT_{PMP}$ is provided through a vapor cell 18. In the example of FIG. 1, the optical pump beam $OPT_{PMP}$ and the optical probe beam $OPT_{PRB}$ are provided along orthogonal axes with respect to each other through the vapor cell 18, with the optical pump beam $OPT_{PMP}$ being provided approximately parallel (e.g., collinearly) with a sensitive axis of the atomic sensor system 10. The atomic sensor system 10 further includes a magnetic field generator 20 configured to generate a bias magnetic field $B_{BIAS}$ that is provided through the vapor cell 18 in a direction that is substantially parallel with the optical pump beam $OPT_{PMP}$. The bias magnetic field $B_{BIAS}$ can be configured to stimulate precession of the alkali metal vapor in the vapor cell 18 in a resonant condition to substantially amplify the modulation of the polarization vector of the alkali metal vapor in the vapor cell 18 in response to magnetic fields applied orthogonally with respect to the optical pump beam $OPT_{PMP}$ (e.g., external orthogonal magnetic field components).

As an example, the vapor cell 18 can be configured as a sealed cell having a transparent or translucent casing that includes an alkali metal vapor (e.g., cesium (Cs) or rubidium (Rb)) and can include a noble gas isotope (e.g., argon (Ar) or xenon (Xe)). The wavelength of the optical pump beam $OPT_{PMP}$ can correspond to an emission line of the alkali metal vapor in the vapor cell 18 (e.g., D1 or D2). The vapor cell 18 can thus comprise the operative physics portion of the atomic sensor system 10. Specifically, the optical pump beam $OPT_{PMP}$ can be provided through the vapor cell 18 to spin-polarize the alkali metal vapor therein. As an example, noble gas isotopes within the vapor cell 18 can precess in the presence of the bias magnetic field $B_{BIAS}$, such that the spin-polarized alkali metal vapor particles can have their spin-polarization modulated to result in a component of the net spin polarization being aligned with the precessing noble gas isotopes. The precession of the noble gas isotopes can thus be measured by a detection beam $OPT_{DET}$ corresponding to the optical probe beam $OPT_{PRB}$ exiting the vapor cell 18. As an example, the Faraday rotation of the linearly-polarized detection beam $OPT_{DET}$ exiting the vapor cell 18 can be determined based on a projection of the spin-polarization of the alkali metal vapor in the vapor cell 18 along the axis orthogonal to the optical pump beam $OPT_{PMP}$. Accordingly, a rotation of the atomic sensor system 10, a magnitude of an external magnetic field, or a spin precession frequency or phase can be measured in response to determining the precession of the noble gas isotopes.

It is to be understood that, as described herein, the optical probe beam $OPT_{PRB}$ and the detection beam $OPT_{DET}$ correspond to the same optical beam, with the optical probe beam $OPT_{PRB}$ being provided to the vapor cell 18 and the detection beam $OPT_{DET}$ corresponding to the optical probe beam $OPT_{PRB}$ having exited the vapor cell 18, and thus having undergone a Faraday rotation. Therefore, as described herein, the optical probe beam $OPT_{PRB}$ and the detection beam $OPT_{DET}$ can be described interchangeably with respect to Faraday rotation. Specifically, the optical probe beam $OPT_{PRB}$ experiences Faraday rotation as it passes through the vapor cell 18, with such Faraday rotation being measured on the detection beam $OPT_{DET}$.

In the example of FIG. 1, the atomic sensor system 10 includes a photodetector assembly 22 that includes a polarizing beam-splitter 24 that is configured to separate the detection beam $OPT_{DET}$ into orthogonal polarizations. The photodetector assembly 22 also includes a first photodetector 26 and a second photodetector 28 (e.g., first and second photodiodes) that are associated with the respective orthogonal polarizations. The first photodetector 26 is configured to generate a first intensity signal $INTS_1$ and the second photodetector 28 is configured to generate a second intensity signal $INTS_2$ that can each correspond to an intensity of the respective orthogonal components of the detection beam $OPT_{DET}$. Therefore, a difference between the first and second intensity signals $INTS_1$ and $INTS_2$ can correspond to a Faraday rotation of the detection beam $OPT_{DET}$. The intensity signals $INTS_1$ and $INTS_2$ are provided to a detection system 30 that is configured to calculate a measurable external parameter SNS of the atomic sensor system 10 based on the Faraday rotation of the detection beam $OPT_{DET}$, as determined by the intensity signals $INTS_1$ and $INTS_2$. For example, the measurable external parameter SNS can correspond to one or more of a rotation of the atomic sensor system 10, a magnitude of an external magnetic field, and a spin precession frequency or phase.

A change in the Faraday rotation of the detection beam $OPT_{DET}$ that is measured, as described previously, can result from the external parameter that is to be measured. However, the change in the Faraday rotation can also result from a change in the wavelength of the optical probe beam $OPT_{PRB}$ relative to a wavelength associated with an absorption peak corresponding to a maximum absorption of the photons of the optical probe beam $OPT_{PRB}$ by the alkali metal vapor in the vapor cell 18. At such wavelength of the absorption peak, the alkali metal vapor in the vapor cell 18 can exhibit approximately zero circular birefringence, and thus no Faraday rotation of the detection beam $OPT_{DET}$ absent the external parameter. Therefore, the optical probe beam $OPT_{PRB}$ can have a wavelength that is detuned, such that the wavelength is shorter or longer than the wavelength associated with the absorption peak. However, environmental conditions (e.g., changes in temperature) and/or instability in electrical current excitation of the probe laser 14 can result in changes to the frequency (i.e., wavelength) of the optical probe beam $OPT_{PRB}$, which can affect the Faraday rotation per unit alkali polarization vector component parallel to the direction of propagation of the detection beam $OPT_{DET}$. Such effects on the Faraday rotation of the detection beam $OPT_{DET}$ can be indistinguishable from Faraday rotation resulting from the external parameter affecting the atomic sensor system 10, thus resulting in errors to the measurable external parameter SNS.

To stabilize the frequency of the optical probe beam $OPT_{PRB}$, the detection system 30 includes a probe controller 32. In the example of FIG. 1, the probe laser 14 is modulated with a modulation signal DTH. As an example, the modulation signal DTH can be a square-wave signal that is modulated onto a current that is provided in an active region of the probe laser 14 to generate the optical probe beam $OPT_{PRB}$. Therefore, the optical probe beam $OPT_{PRB}$ can be modulated about a center frequency that can be maintained at the frequency corresponding to the wavelength associated with the absorption peak. For example, the modulation signal DTH can have a minimum amplitude and a maximum amplitude corresponding respectively to approximately equal and opposite Faraday rotation of the detection beam $OPT_{DET}$. As a result, in response to the center frequency of the optical probe beam $OPT_{PRB}$ being approximately equal to the frequency of the absorption peak, a sum of the first and second intensity signals $INTS_1$ and $INTS_2$ is approximately equal in each of the minimum and maximum amplitudes of the modulation signal DTH. As a result, a difference in the sum of the first and second intensity signals $INTS_1$ and $INTS_2$ in each of the minimum and maximum amplitudes of the modulation signal DTH can be indicative of a frequency drift of the optical probe beam $OPT_{PRB}$, as generated by the probe laser 14. Therefore, the probe controller 32 can adjust modulation of the probe laser 32, demonstrated in the example of FIG. 1 via a feedback signal FDBK, to maintain the center frequency of the optical probe beam $OPT_{PRB}$ approximately at the absorption peak in a feedback manner.

Figure 2:
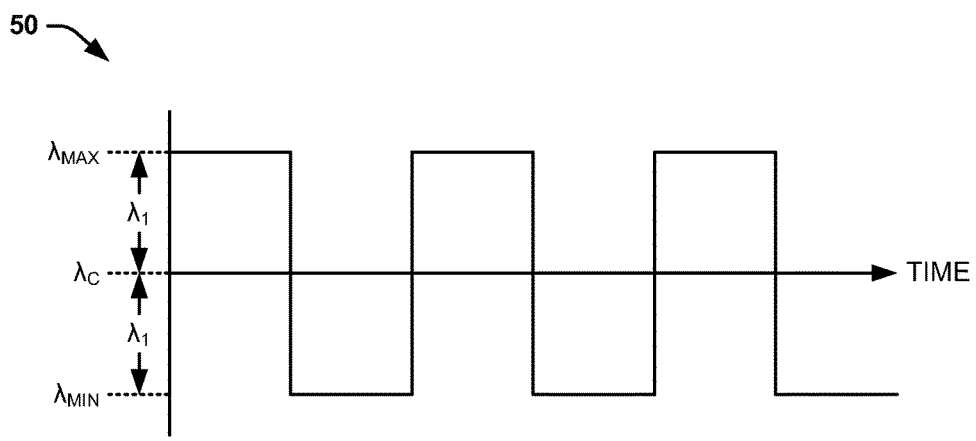
FIG. 2 illustrates an example timing diagram of a modulation signal waveform.

FIG. 2 illustrates an example timing diagram 50 of a modulation signal waveform. As an example, the diagram 50 demonstrates the modulation signal DTH plotted as a function of time. The modulation signal DTH is demonstrated in the example of FIG. 2 as a square-wave signal oscillating about a center wavelength $\lambda_C$. The modulation signal DTH is demonstrated as having a maximum amplitude corresponding to a first wavelength $\lambda_{MAX}$ and a minimum amplitude corresponding to a second wavelength $\lambda_{MIN}$. In the example of FIG. 2, the first and second wavelengths $\lambda_{MAX}$ and $\lambda_{MIN}$ are separated equally and oppositely about the center wavelength $\lambda_C$ by a wavelength difference $\lambda_1$.

Figure 3:
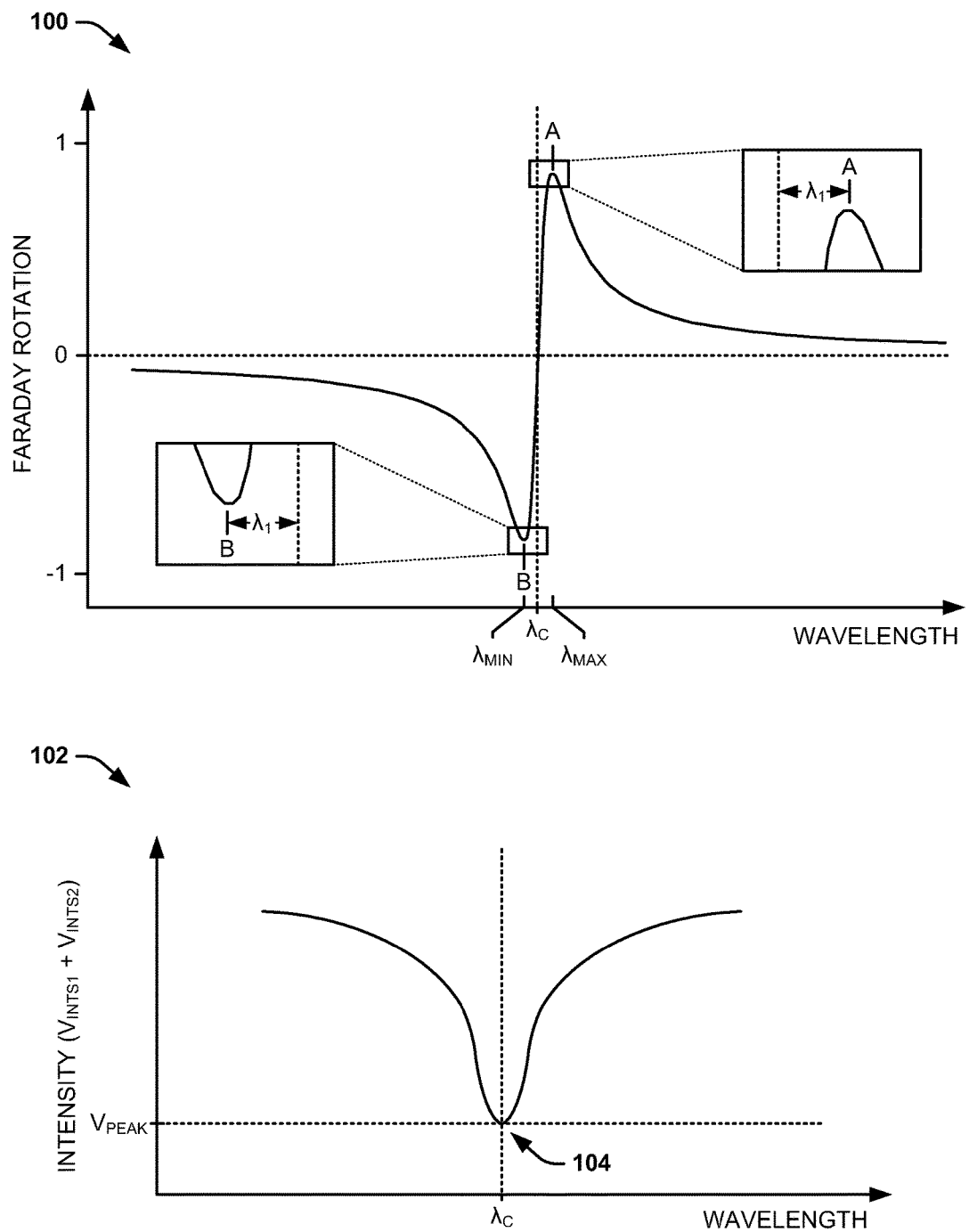
FIG. 3 illustrates an example of graphs associated with a wavelength of an optical probe beam.

FIG. 3 illustrates an example of graphs associated with a wavelength of the optical probe beam $OPT_{PRB}$. Specifically, FIG. 3 illustrates a graph 100 of Faraday rotation per unit alkali polarization vector component parallel to the direction of the optical probe beam $OPT_{PRB}$ as a function of wavelength. FIG. 3 also illustrates a graph 102 of intensity of the detection beam $OPT_{DET}$ as a function of wavelength.

The graph 100 demonstrates a magnitude of Faraday rotation on the vertical axis in arbitrary units and centered about zero, and a wavelength detuning of the optical probe beam $OPT_{PRB}$ from resonance of the alkali metal vapor in the vapor cell 18, demonstrated at the center wavelength $\lambda_C$. As described previously, the Faraday rotation of the detection beam $OPT_{DET}$ can be measured to determine, for example, a rotation of the atomic sensor system 10 or a magnitude of an external magnetic field. However, as demonstrated by the graph 50, the Faraday rotation of the detection beam $OPT_{DET}$ can be strongly dependent on the wavelength of the optical probe beam $OPT_{PRB}$. Therefore, if the wavelength of the optical probe beam $OPT_{PRB}$ is unstable, then the Faraday rotation of the detection beam $OPT_{DET}$ is affected, which can thus provide errors in the measurement of the measurable external parameter SNS (e.g., the rotation of the atomic sensor system 10 or the magnitude of the external magnetic field). Accordingly, the probe controller 32 can stabilize the wavelength of the optical probe beam $OPT_{PRB}$ based on the modulation of the optical probe beam $OPT_{PRB}$ about the center frequency associated with the center wavelength $\lambda_C$.

The graph 102 demonstrates a magnitude of intensity of the detection beam $OPT_{DET}$ on the vertical axis in arbitrary units. In the example of FIG. 3, the intensity is measured by the first and second photodetectors 26 and 28 as respective voltages $V_{INTS1}$ and $V_{INTS2}$. Therefore, the intensity of the detection beam $OPT_{DET}$ by can be determined based on a sum of the $V_{INTS1}$ and $V_{INTS2}$. An inverse magnitude of the intensity of the detection beam $OPT_{DET}$ can correspond to absorption of the photons of the optical probe beam $OPT_{PRB}$ by the alkali metal vapor in the vapor cell 18, such that lower values of the sum of the voltages $V_{INTS1}$ and $V_{INTS2}$ corresponds to greater absorption of the photons of the optical probe beam $OPT_{PRB}$. Therefore, the lowest value of the intensity corresponds to an absorption peak 104 of the absorption of the photons of the optical probe beam $OPT_{PRB}$ by the alkali metal vapor in the vapor cell 18.

With additional reference to the timing diagram 50, the modulation signal DTH can be provided such that the center wavelength $\lambda_C$ can be set to the absorption peak 104, and thus to a wavelength at which the optical probe beam $OPT_{PRB}$ experiences substantially zero Faraday rotation absent the external parameter. However, the maximum amplitude of the modulation signal DTH corresponding to the first wavelength $\lambda_{MAX}$ can be associated with a maximum Faraday rotation in a first direction, demonstrated in the example of FIG. 3 as the positive peak "A". Thus, the first wavelength $\lambda_{MAX}$ can be associated with a red detuning of the optical probe beam $OPT_{PRB}$ to provide a substantial maximum Faraday rotation in the first direction, such that the peak "A" is separated from the center wavelength $\lambda_C$ by the wavelength difference $\lambda_1$. Similarly, the minimum amplitude of the modulation signal DTH corresponding to the second wavelength $\lambda_{MIN}$ can be associated with a maximum Faraday rotation in a second direction opposite the first direction, demonstrated in the example of FIG. 3 as the negative peak "B". Thus, the second wavelength $\lambda_{MIN}$ can be associated with a blue detuning of the optical probe beam $OPT_{PRB}$ to provide a substantial maximum Faraday rotation in the second direction, such that the peak "B" is separated from the center wavelength $\lambda_C$ by the wavelength difference $\lambda_1$ equally and oppositely with respect to the peak "A". Therefore, the maximum Faraday rotation in the second direction can be a Faraday rotation that is substantially approximately equal and opposite the maximum Faraday rotation in the first direction. As a result, as described herein, a signal-to-noise ratio (SNR) for detection of the external measurable parameter SNS can be substantially maximized while the frequency of the optical probe beam $OPT_{PRB}$ is substantially stabilized.

As an example, the wavelength difference between the Faraday rotation peaks "A" and "B" can correspond to a full-width half-max wavelength linewidth of the absorption spectrum of the alkali metal vapor in the vapor cell 18. The amplitude of the modulation signal DTH at the maximum amplitude and the minimum amplitude, corresponding respectively to the Faraday rotation peaks "A" and "B", respectively, can therefore be a function of an alkali resonance (i.e., absorption) linewidth that can be a function of a gas mixture and gas number density in the vapor cell 18 (e.g., including one or more buffer gases). Thus, the amplitude of the modulation signal DTH at the maximum amplitude and the minimum amplitude can be selected and optimized based on the characteristics of the given atomic sensor system 10 to achieve the Faraday rotation peaks "A" and "B" at the maximum amplitude and the minimum amplitude, respectively, of the modulation signal DTH.

Figure 4:
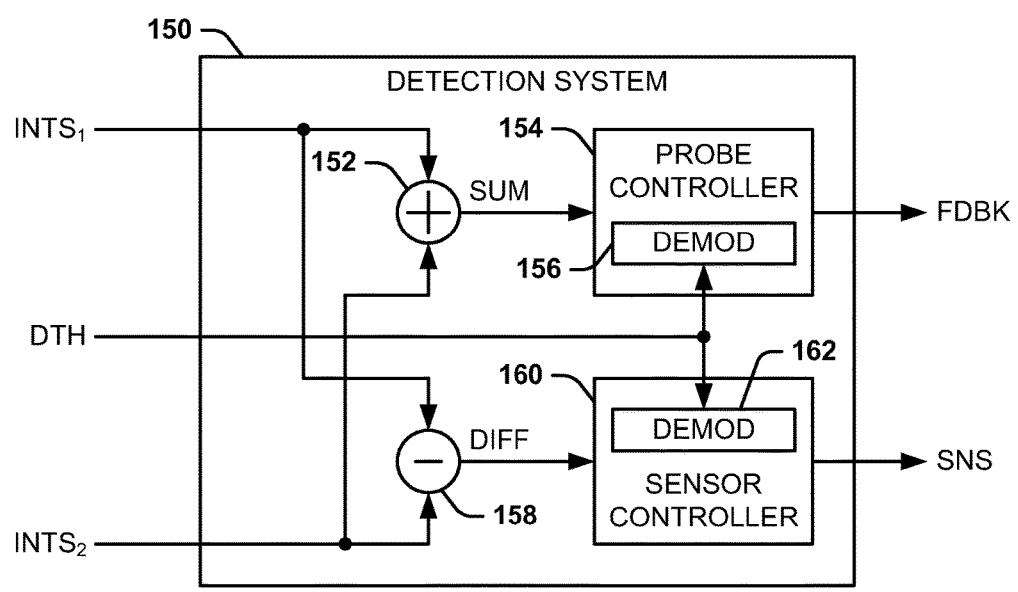
FIG. 4 illustrates an example of a detection system.

FIG. 4 illustrates an example of a detection system 150. As an example, the detection system 150 can correspond to the detection system 30 in the example of FIG. 1. In the example of FIG. 4, the detection system 150 receives each of the first and second intensity signals $INTS_1$ and $INTS_2$ and the modulation signal DTH, and is configured to provide the external measurable parameter SNS and the feedback signal FDBK as outputs. As an example, the first and second intensity signals $INTS_1$ and $INTS_2$ can be provided from the respective first and second photodetectors 26 and 28 in the photodetector assembly 22 in the example of FIG. 1.

The detection system 150 includes a summation component 152 configured to add the first and second intensity signals $INTS_1$ and $INTS_2$ to generate a summation signal SUM corresponding to a sum of the first and second intensity signals $INTS_1$ and $INTS_2$. The summation signal SUM is provided to a probe controller 154, which can correspond to the probe controller 32 in the example of FIG. 1. In the example of FIG. 4, the probe controller 154 includes a demodulator 156 that is configured to demodulate the summation signal SUM at the frequency of the modulation signal DTH. As described previously, in response to the center frequency of the optical probe beam $OPT_{PRB}$ being approximately equal to the frequency of the absorption peak 104, the summation signal SUM has an amplitude that is approximately equal in each of the minimum and maximum amplitudes of the modulation signal DTH. As a result, in response to a frequency drift of the center frequency of the optical probe beam $OPT_{PRB}$ from the center wavelength $\lambda_C$, and thus the absorption peak 104, the amplitude of the summation signal SUM will vary between the minimum and maximum amplitudes of the modulation signal DTH. Therefore, the demodulated summation signal SUM can be indicative of a difference between the wavelength of the optical probe beam $OPT_{PRB}$ and the center wavelength $\lambda_C$, and thus a magnitude of the frequency drift of the optical probe beam $OPT_{PRB}$ from the center frequency corresponding to the center wavelength $\lambda_C$. Accordingly, the feedback signal FDBK can be provided to correct one of the electrical current provided to the associated probe laser or the temperature of the associated probe laser (e.g., the probe laser 14 in the example of FIG. 1) to maintain the center frequency of the optical probe beam $OPT_{PRB}$ at the center wavelength $\lambda_C$ corresponding to the maximum absorption of the optical probe beam $OPT_{PRB}$ by the alkali metal vapor.

The detection system 150 also includes a difference component 158 and a sensor controller 160. The difference component 158 is configured to subtract the first and second intensity signals $INTS_1$ and $INTS_2$ to generate a difference signal DIFF corresponding to a difference of the first and second intensity signals $INTS_1$ and $INTS_2$. The difference signal DIFF is provided to the sensor controller 160 that is configured to calculate the measurable external parameter SNS (e.g., rotation about a sensitive axis and/or a magnitude of an external magnetic field). As described previously, the modulation signal DTH provides a Faraday rotation of the optical probe beam $OPT_{PRB}$ equally and oppositely with respect to the absorption peak 104 at the center wavelength $\lambda_C$. Therefore, such a polarity reversal of the Faraday rotation results in a polarity reversal of the difference signal DIFF.

As an example, the Faraday rotation at each of the peaks "A" and "B" in the example of FIG. 3 can be set to generate a zero magnitude of the difference signal DIFF. As an example, the intensity signals $INTS_1$ and $INTS_2$ can have approximately equal amplitudes. For example, the Faraday rotation magnitude can be an integer multiple of $\pi/2$ when zero Faraday rotation would provide an equal intensity signal on the respective photodetectors 26 and 28. Therefore, at equal amplitudes of the intensity signals $INTS_1$ and $INTS_2$, responsivity and gain changes of the photodetectors 26 and 28 can be substantially canceled at a Faraday rotation polarity reversal. Such cancellation can occur based on multiplication of the intensity of the orthogonal components of the detection beam $OPT_{DET}$ by a given factor based on the gain and responsivity of the photodetectors 26 and 28, such that a residual error will occur due to the difference in the absolute value of the error in the multiplied smaller versus larger signal as the Faraday rotation switches between the two peaks "A" and "B".

In the example of FIG. 4, the sensor controller 160 includes a demodulator 162 that is configured to demodulate the difference signal DIFF at the frequency of the modulation signal DTH. Therefore, the demodulated difference signal DIFF can be indicative of the Faraday rotation of the detection beam $OPT_{DET}$ independent of differential changes in offsets associated with the photodetectors 26 and 28, with responsivity and gain drifts associated with the photodetectors 26 and 28 being substantially suppressed, based on the cancellation of the responsivity and gain changes of the photodetectors 26 and 28 at the Faraday rotation polarity reversal. The sensor controller 160 can thus calculate the measurable external parameter SNS based on the measured Faraday rotation of the detection beam $OPT_{DET}$. Accordingly, based on the stabilization of the center frequency of the optical probe beam $OPT_{PRB}$ at the center wavelength $\lambda_C$, errors in the calculation of the measurable external parameter SNS resulting from frequency drift of the optical probe beam $OPT_{PRB}$ can be substantially mitigated.

It is to be understood that the atomic sensor system 10 is not intended to be limited to the examples of FIGS. 1-4. As an example, while the probe controller 32 is described herein as stabilizing the center frequency associated with the center wavelength $\lambda_C$ of the optical probe beam $OPT_{PRB}$ at the approximate absorption peak 104, it is to be understood that the probe controller 32 can be programmed to maintain the center frequency of the optical probe beam $OPT_{PRB}$ at a different frequency reference point. For example, depending on the state distribution of the polarized alkali vapor in the vapor cell 18, an offset relative to the absorption peak 104 may provide improvements in SNR. The offset can be achieved based on the signal DTH including an offset such that the maximum amplitude and minimum amplitude are not symmetric about zero, or based on the center wavelength $\lambda_C$ being adjusted such that the demodulated summation signal SUM is set/maintained at a specific non-zero target value, where a target value of zero can correspond to the absorption peak 104.

Additionally, the maximum and minimum amplitudes of the modulation signal DTH are not limited to the Faraday rotation peaks "A" and "B", respectively. For example, for the vapor cell 18 having sufficient absorption of the probe beam per unit length of distance through the cell, such as can occur with a sufficiently high cell temperature, the absorption of the optical probe beam $OPT_{PRB}$ at the wavelength corresponding to maximum Faraday rotation can be large enough that no detectable probe beam light passes through the cell based on substantially all of the photons optical probe beam $OPT_{PRB}$ being absorbed. As another example, with a sufficient optical power of the optical probe beam $OPT_{PRB}$, the respective maximum and minimum amplitudes of the modulation signal DTH can be greater than the Faraday rotation peak "A" and less than the Faraday rotation peak "B", respectively, such as to result in a greater SNR for measurements of the measurable external parameter SNS. Furthermore, while the modulation signal DTH is demonstrated in the example of FIG. 2 as having an approximate 50% duty-cycle, other duty-cycles can be implemented for the modulation signal DTH depending on the characteristics of the vapor cell 18 and the contents therein to substantially maximize the SNR for measurements of the measurable external parameter SNS. Therefore, the maximum and minimum amplitudes, as well as the duty-cycle, of the modulation signal DTH can be tuned to provide a substantial maximum SNR of the measurable external parameter SNS. Accordingly, the atomic sensor system 10 can be configured in a variety of different ways.

Figure 5:
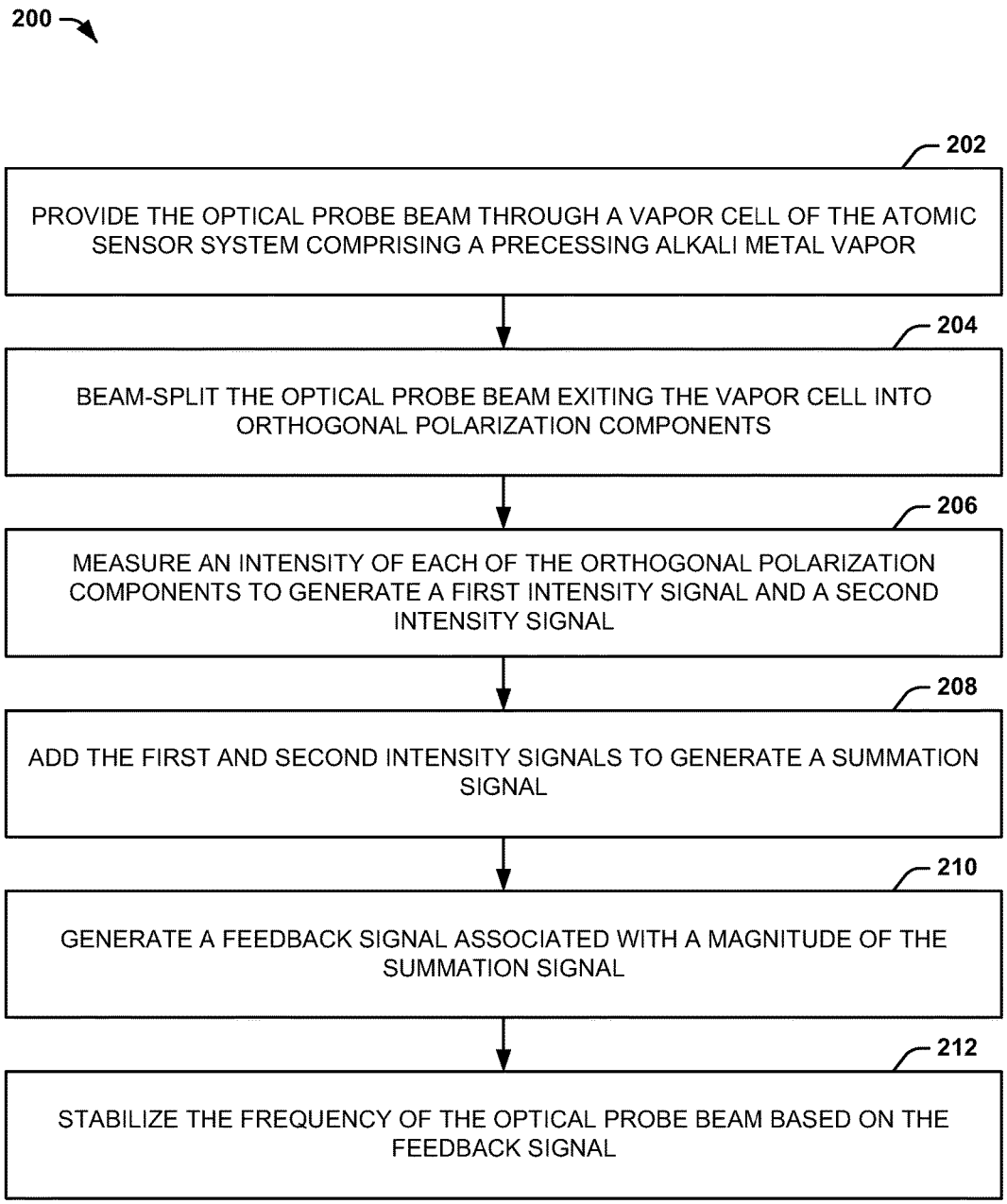
FIG. 5 illustrates an example of a method for stabilizing a frequency of an optical probe beam in an atomic sensor system.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for stabilizing a frequency of an optical probe beam (e.g., the optical probe beam $OPT_{PRB}$) in an atomic sensor system (e.g., the atomic sensor system 10). At 202, the optical probe beam is provided through a vapor cell (e.g., the vapor cell 18) of the atomic sensor system comprising a precessing alkali metal vapor. At 204, the optical probe beam exiting the vapor cell (e.g., the detection beam $OPT_{DET}$) is beam-split into orthogonal polarization components. At 206, an intensity of each of the orthogonal polarization components is measured to generate a first intensity signal (e.g., the first intensity signal $INTS_1$) and a second intensity signal (e.g., the second intensity signal $INTS_2$). At 208, the first and second intensity signals are added to generate a summation signal (e.g., the summation signal SUM). At 210, a feedback signal (e.g., the feedback signal FDBK) associated with a magnitude of the summation signal is generated. At 212, the frequency (e.g., the center frequency) of the optical probe beam is stabilized (e.g., at the center wavelength $\lambda_C$) based on the feedback signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An atomic sensor system comprising:
    a vapor cell comprising an alkali metal vapor that precesses in response to a magnetic field;
    a probe laser configured to generate an optical probe beam that is modulated about a center frequency and which is provided through the vapor cell;
    a photodetector assembly configured to generate a first intensity signal corresponding to a Faraday rotation associated with a detection beam that is associated with the optical probe beam exiting the vapor cell, the photodetector assembly comprising:
        a polarizing beam-splitter,
        a first photodetector, and
        a second photodetector,
        wherein the polarizing beam-splitter is configured to separate the detection beam into first and second orthogonal polarization signal components,
        wherein the first and second photodetectors are configured to generate the first intensity signal and a second intensity signal corresponding to the first and second orthogonal polarization signal components, respectively; and
    a detection system comprising:
        a summation component configured to add the first and second intensity signals to generate a summation signal, and
        a probe controller configured to demodulate the summation signal at a frequency corresponding to a modulation frequency of the optical probe beam and to generate a feedback signal based on the demodulated summation signal that is provided to the probe laser to substantially stabilize the center frequency of the optical probe beam based on the feedback signal.

2. The system of claim 1, wherein the detection system comprises a difference component configured to subtract the first intensity signal from the second intensity signal to generate a difference signal that corresponds to the Faraday rotation of the detection beam, and wherein the detection system comprises a sensor controller configured to demodulate the difference signal to generate a sensor output signal.

3. The system of claim 1, wherein the feedback signal is configured to maintain the center frequency of the optical probe beam at a frequency corresponding to a substantial maximum absorption of the optical probe beam by the alkali metal vapor.

4. The system of claim 1, wherein the optical probe beam is frequency-modulated via a square-wave signal having a positive amplitude and a negative amplitude that are approximately equal and opposite about the center frequency.

5. The system of claim 4, wherein the positive amplitude of the square-wave signal corresponds to a substantial maximum Faraday rotation associated with the optical probe beam in a first direction and the negative amplitude of the square-wave signal corresponds to a substantial maximum Faraday rotation associated with the optical probe beam in a second direction that is opposite the first direction.

6. The system of claim 1, wherein the intensity signal comprises a first intensity signal and a second intensity signal that correspond, respectively, to orthogonal polarizations of the optical probe beam, wherein the detection system is configured to demodulate a summation signal corresponding to a sum of the first and second intensity signals to generate the feedback signal.

7. An NMR gyroscope system comprising the atomic sensor system of claim 1.

8. An atomic magnetometer system comprising the atomic sensor system of claim 1.

9. A method for stabilizing a frequency of an optical probe beam in an atomic sensor system, the method comprising:

providing the optical probe beam through a vapor cell of the atomic sensor system comprising a precessing alkali metal vapor;

beam-splitting the optical probe beam exiting the vapor cell into orthogonal polarization components;

measuring an intensity of each of the orthogonal polarization components to generate a first intensity signal and a second intensity signal;

adding the first and second intensity signals to generate a summation signal;

generating a feedback signal associated with a magnitude of the summation signal; and stabilizing the frequency of the optical probe beam based on the feedback signal.

10. The method of claim 9, further comprising:

modulating the frequency of the optical probe beam about a center frequency based on a modulation signal; and demodulating the summation signal at a frequency of the modulation signal to generate the feedback signal, wherein stabilizing the frequency of the optical probe beam comprises stabilizing the center frequency of the optical probe beam based on the feedback signal.

11. The method of claim 10, wherein stabilizing the center frequency of the optical probe beam comprises maintaining the center frequency of the optical probe beam at a frequency corresponding to a substantial maximum absorption of the optical probe beam by the alkali metal vapor.

12. The method of claim 10, wherein modulating the frequency of the optical probe beam comprises modulating the frequency of the optical probe beam about the center frequency based on the modulation signal configured as a square-wave signal having a positive amplitude and a negative amplitude that are approximately equal and opposite about the center frequency.

13. The method of claim 12, further comprising:

setting the positive amplitude of the modulation signal to correspond to a first frequency of the optical probe beam associated with a substantial maximum Faraday rotation in a first direction; and setting the negative amplitude of the modulation signal to correspond to a second frequency of the optical probe beam associated with a substantial maximum Faraday rotation in a second direction opposite the first direction.

14. An atomic sensor system comprising:

a vapor cell comprising an alkali metal vapor that precesses in response to a magnetic field;

a probe laser configured to generate an optical probe beam that is modulated about a center frequency via a square-wave modulation signal and which is provided through the vapor cell;

a photodetector assembly configured to generate a first intensity signal and a second intensity signal that correspond, respectively, to orthogonal polarizations of a detection beam corresponding to the optical probe beam exiting the vapor cell; and a detection system configured to add the first and second intensity signals to generate a summation signal and to demodulate the summation signal at a frequency of the square-wave modulation signal to generate a feedback signal that is provided to the probe laser to substantially stabilize the center frequency of the optical probe beam.

15. The system of claim 14, wherein the detection system comprises a difference component configured to subtract the first intensity signal from the second intensity signal to generate a difference signal that corresponds to the Faraday rotation of the detection beam, wherein the detection system comprises a sensor controller configured to demodulate the difference signal to generate a sensor output signal.

16. The system of claim 14, wherein the feedback signal is configured to maintain the center frequency of the optical probe beam at a frequency corresponding to a substantial maximum absorption of the optical probe beam by the alkali metal vapor.

17. The system of claim 14, wherein the square-wave modulation signal comprises a positive amplitude and a negative amplitude that are approximately equal and opposite about the center frequency.

18. The system of claim 17, wherein the positive amplitude of the square-wave signal corresponds to a substantial maximum Faraday rotation associated with the optical probe beam in a first direction and the negative amplitude of the square-wave signal corresponds to a substantial maximum Faraday rotation associated with the optical probe beam in a second direction that is opposite the first direction.

* * * * *